United States Patent [19]
Lee et al.

[11] Patent Number: 5,561,639
[45] Date of Patent: Oct. 1, 1996

[54] SEMICONDUCTOR MEMORY DEVICE WITH HIGH SPEED DETECT FUNCTION

[75] Inventors: Kyoung S. Lee; Kang C. Lee; Kyeong J. Jang; Kwang Y. Chung; Ho J. Lee; Huy C. Bae, all of Kyoungkido, Rep. of Korea

[73] Assignee: Hyundai Electronics Industries Co., Ltd., Kyoungkido, Rep. of Korea

[21] Appl. No.: 518,018

[22] Filed: Aug. 22, 1995

[30] Foreign Application Priority Data

Aug. 23, 1994 [KR] Rep. of Korea .................. 1994-20820

[51] Int. Cl.$^6$ ............................................... G11C 8/00
[52] U.S. Cl. .............. 365/230.06; 365/189.11; 365/201
[58] Field of Search .................. 365/230.06, 201, 365/189.11

[56] References Cited

U.S. PATENT DOCUMENTS

| | | | |
|---|---|---|---|
| 5,323,357 | 6/1994 | Kaneko | 365/230.06 |
| 5,331,594 | 7/1994 | Hotta | 365/230.06 |
| 5,408,436 | 4/1995 | Moloney et al. | 365/230.06 |

Primary Examiner—Joseph E. Clawson, Jr.
Attorney, Agent, or Firm—Keck, Mahin & Cate

[57] ABSTRACT

Disclosed is a semiconductor memory device carrying out reading and writing operations of data, comprising memory means consisting of a plurality of memory cells for storing data; test signal generation means for generating a test signal upon a test being carried out; at least one first buffer for receiving an external address bit and generating inverting and noninverting address bits; at least one second address buffer for selectively receiving said external address bit in response to said test signal from said test signal generation means and generating said inverting and noninverting address bits or the signals of the same logic value through two output terminals thereof; decoding means for receiving output signals from said first and second address buffers and selecting one or plural corresponding memory cells of said memory means; and voltage level compensation means for compensating a voltage level applied to each of words lines of said memory cells selected by said decoding means in accordance with said test signal from said test signal generation means. The device can reduce the test time by selecting plural memory cell rows in accordance with any one address applied from an external during burn-in test, differently from the normal operation.

4 Claims, 3 Drawing Sheets

5,561,639

SEMICONDUCTOR MEMORY DEVICE WITH HIGH SPEED DETECT FUNCTION

BACKGROUND OF THE INVENTION

1. Field of the Invention

The present invention relates to a semiconductor memory device with a high speed test function and, more particularly, to a semiconductor memory device which carries out a stress test, such as a burn-in test, of memory cells therein.

2. Description of the Prior Art

In general, since many process steps are required to fabricate a semiconductor device, failure causing factors are included in the semiconductor device fabricated thus. Burn-in test is used for detecting such failure causing factors, in particular, an infant morality.

For example, in a DRAM (Dynamic Random Access Memory) of semiconductor memory devices, a main memory region to a peripheral circuit region has the ratio of 80 to 20 and the ratio that the main memory region is occupied in the total dimension is very large. Herein, there are several methods for testing a failure of memory cells, one of which is a burn-in test that is to detect a reliability, in particular, to detect whether a failure is generated in a gate oxide or not by applying a high voltage to a word line.

In prior art, a high voltage of about 8 V has been applied to each of memory cells during burn-in test in the same manner as the normal operation of the memory device. Thus, in the prior memory device, a burn-in test is carried out by the procedure that any addresses are received through plural address buffers therein and then the memory cell corresponding to the addresses received thus is selected by means of a decoder.

For example, in case of one mega DRAM which is a x1 type that one data is inputted/outputted for one cycle and consists of four memory blocks, it has ten row/column addresses. Accordingly, an RAS(Row Address strobe) signal is applied and the row of the predetermined memory cell is selected through a row decoder receiving ten row addresses. Thus, two row addresses of ten row addresses are used as a block select address and provided to select one block of the four memory blocks.

However, since a burn-in test of the memory device should be carried out in the same method as the writing method of the normal operation, there is the problem that many times are necessary to carry out the burn-in test thereof.

SUMMARY OF THE INVENTION

It is an object of this invention to provide a semiconductor memory device having a high speed test function, in which a plurality of memory cell rows are selected in accordance with an externally applied address during performing burn-in test, differently from the normall operation, so as to reduce the test time.

According to one aspect of the present invention, the semiconductor memory device carrying out reading and writing operations of data, said memory device comprising memory means consisting of a plurality of memory cells for storing data; test signal generation means for generating a test signal upon a test being carried out; at least one first buffer for receiving an external address bit and generating inverting and noninverting address bits; at least one second address buffer for selectively receiving said external address bit in response to said test signal from said test signal generation means and generating said inverting and noninverting address bits or the signals of the same logic value through two output terminals thereof; decoding means for receiving output signals from said first and second address buffers and selecting one or plural corresponding memory cells of said memory means; and voltage level compensation means for compensating a voltage level applied to each of words lines of said memory cells selected by said decoding means in accordance with said test signal from said test signal generation means.

BRIEF DESCRIPTION OF THE DRAWINGS

This invention may be better understood and its object and advantage will become apparent to those skilled in the art by reference to the accompanying drawings as follows.

DESCRIPTION OF THE PREFERRED EMBODIMENT

Hereinafter, this invention will be described as an example of 1 mega DRAM of a x1 type.

Figure 1:
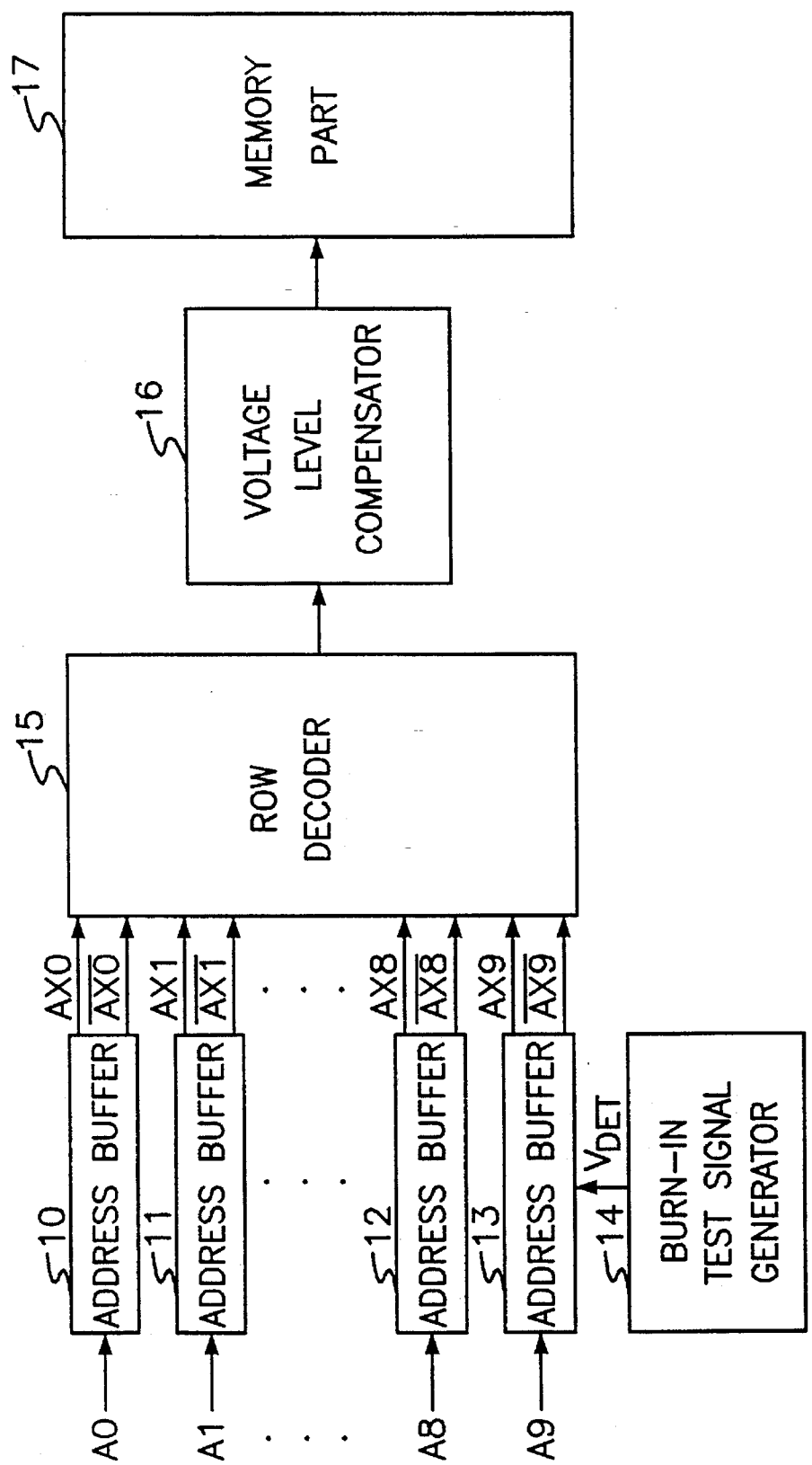
FIG. 1 is a schematic block diagram of 1 mega DRAM in accordance with an embodiment of this invention.

Referring to FIG. 1, the novel semiconductor memory device in accordance with the invention comprises ten address buffers 10 to 13, a burn-in test signal generator 14, a row decoder 15, a voltage level compensator 16 and a memory part 17.

The memory part 17 consists of a plurality of memory block and the burn-in test signal generator 14 senses whether the driving voltage from the normal operation state of 4.5 V to 5.5 V to the burn-in state of 7.5 V to 8.5 V is applied, or not and generates a burn-in test signal $V_{DET}$ in accordance with the result of sensing.

One address buffer 13 of the ten address buffers receives one address bit A9 necessary for selecting a row and generates an address bit AX9 and an address bit bar AX9. At this constant, if the burn-in signal $V_{DET}$ is generated, the address buffer 13 outputs output signals of logic "0" through two output terminals thereof.

Other address buffers 10 to 12 receive nine address bits A0–A8 except for the address bit A9 and generate address bits AX0–AX8 and address bit bars AX0 to AX8, respectively.

The decoder 13 receives the output signals of the address buffers 10 to 13 to select the corresponding memory row. The voltage level compensator 16 generates a word line bootstrap input signal ⌀x for compensating the voltage level of each word lines of several memory rows which are selected in response to the burn-in test signal $V_{DET}$.

Figure 2A:
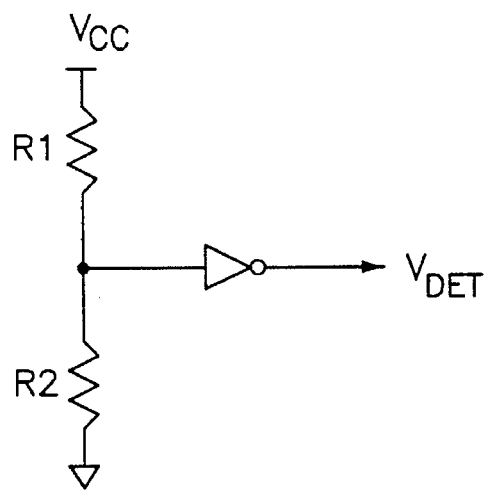
FIG. 2A is a detailed circuit diagram of a burn-in test signal generator shown in FIG. 1.

Referring to FIG. 2A, there is shown a detailed circuit diagram of the burn-in test signal generator 14.

As shown in the drawing, the burn-in test signal generator 14 is provided to divide the driving voltage Vcc into several voltages by using two resistors R1 and R2 connected in series. If the burn-in test signal generator 14 is constructed in such a manner that the driving voltage applied during burn-in test is to be 8 V and a driving voltage applied to the connection point between the two resisters R1 and R2 is to be 5 V, an output signal of an invertor is lowered to logic "0". The output signal lowered to logic "0" is provided as the burn-in test signal $V_{DET}$.

Figure 2B:
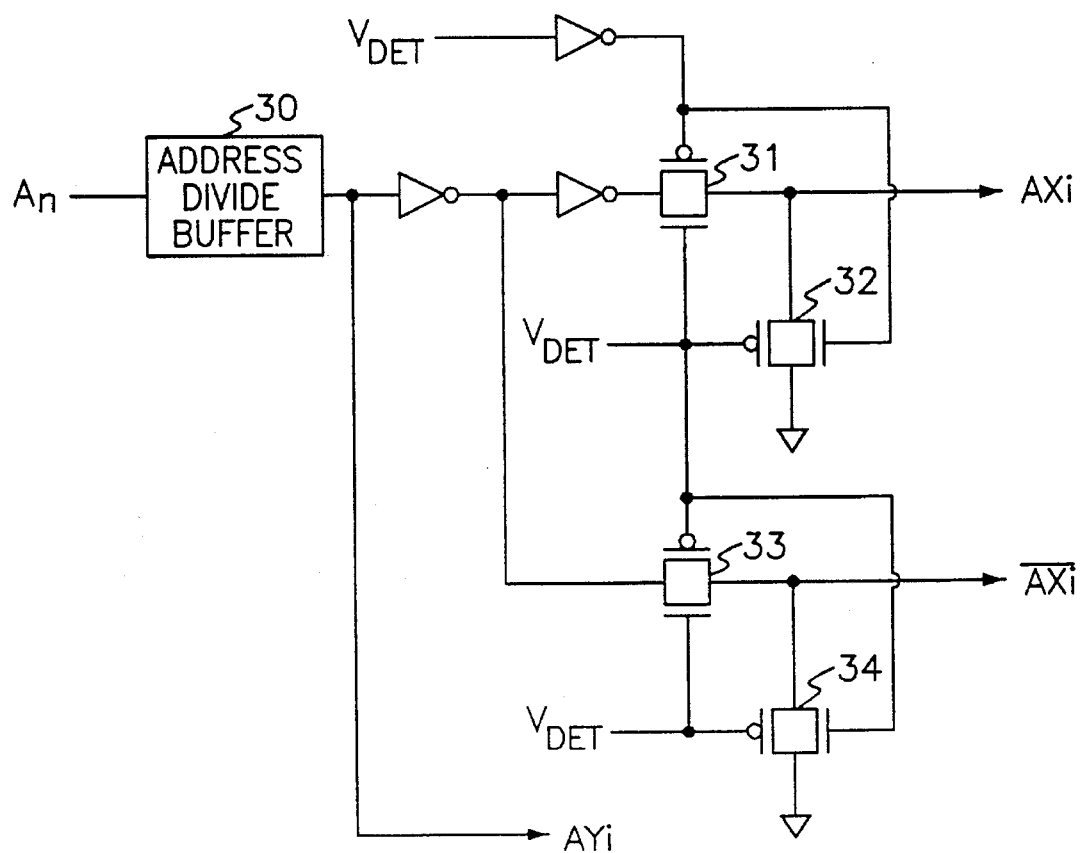
FIG. 2B is a detailed circuit diagram of an address buffer which is controlled by a burn-in test signal, as shown in FIG. 1.

Referring to FIG. 2B, there is shown a detailed circuit diagram of the address buffer controlled by the burn-in test signal.

As shown in the drawing, the address buffer 13 comprises an address divide buffer 30 which receives an external address bit An and outputs a row address bit AXi and a column address bit AYi, and switching parts 31 to 34 which generate the row address bit AXi and the row address bit bar AXI in response to the burn-in test signal $V_{DET}$ as a control signal, when the bun-in test signal $V_{DET}$ is logic "1" and on the other hand, generate the signals of logic "0" through the output terminals thereof, when the burn-in test signal $V_{DET}$ is logic "0".

Accordingly, the output signal of the address buffer 13 of the address buffers is controlled in response to the burn-in test signal $V_{DET}$, and thus several memory cell rows can be selected within one cycle.

In this embodiment, the address bit for selecting the memory block is applied to the address buffer 13, and therefore several memory blocks can be selected within one cycle.

For reference, it is noted that, in case further many buffers such as the address buffer 13 may be used in this embodiment, further many memory blocks can be selected within one cycle.

Figure 2C:
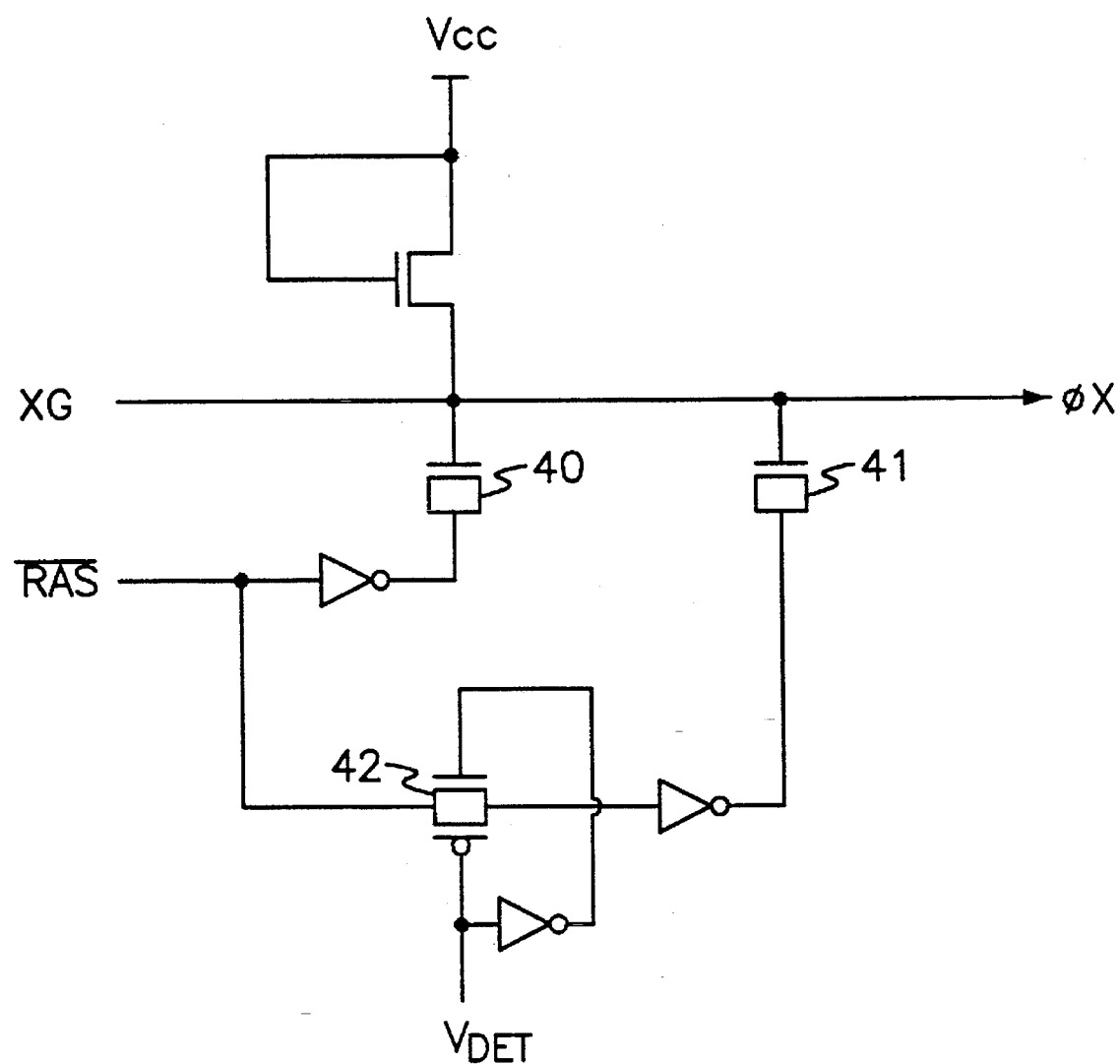
FIG. 2C is a detailed circuit diagram of a voltage level compensator shown in FIG. 1.

Referring to FIG. 2C, there is shown a detailed circuit diagram of the voltage level compensator 16 of FIG. 1.

As shown in this drawing, the voltage level compensator 16 comprises a first bootstrap load 40 connected between an RAS delay signal applying terminal XG and an RAS signal applying terminal, for charging a predetermined voltage in case where the RAS signal is logic "1" and discharging the charged voltage at instant that the RAS signal of logic "1" is changed to logic "0" so as to form a word line bootstrap input signal øx in the normal operation, a switch 42 which is switched in accordance with the burn-in test signal $V_{DET}$, and a second bootstrap load 41 connected between a RAS delay signal applying terminal XG and a RAS signal applying terminal in accordance with the switching state of the switch 42, for compensating the voltage level of the word line bootstrap input signal.

Accordingly, the voltage level compensator 16 generates the level-compensated word line bootstrap input signal øX so that the voltage level of each of the selected word lines can be compensated, although the plurality of word lines are selected during burn-in test.

According to this invention, it has an effect to reduce the test time by selecting plural memory cell rows in accordance with any one address applied from an external during burn-in test, differently from the normal operation.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art which this invention pertains.

What is claimed is:

1. A semiconductor memory device carrying out reading and writing operations of data, said device comprising:

memory means consisting of a plurality of memory cells for storing data;

test signal generation means for generating a test signal upon a test being carried out;

at least one first buffer for receiving an external address bit and generating inverting and noninverting address bits;

at least one second address buffer for selectively receiving said external address bit in response to said test signal from said test signal generation means and generating said inverting and noninverting address bits or the signals of the same logic value through two output terminals thereof;

decoding means for receiving output signals from said first and second address buffers and selecting one or plural corresponding memory cells of said memory means; and voltage level compensation means for compensating a voltage level applied to each of words lines of said memory cells selected by said decoding means in accordance with said test signal from said test signal generation means.

2. The semiconductor memory device as defined in claim 1, wherein said test signal generation means comprises two resistors being connected in series between a driving voltage applying terminal and a ground terminal; and output means connected between said resistors, for generating said test signal in case where a high voltage showing a test state as said driving voltage is applied thereto.

3. The semiconductor memory device as defined in claim 2, wherein said voltage level compensation means comprises a first bootstrap load which is connected between an RAS delay signal applying terminal and an RAS signal applying terminal, and which is enabled during said normal operation state; a switch which is switched in response to said test signal from said test signal generation means; and at least one second bootstrap load connected between an RAS delay signal applying terminal and an RAS signal applying terminal, for compensating said voltage level of a word line bootstrap input signal.

4. The semiconductor memory device as defined in claim 3, wherein said second address buffer receives an address for selecting a row of said memory cell.

* * * * *